United States Patent [19]
Yamauchi

[11] Patent Number: 5,265,058
[45] Date of Patent: Nov. 23, 1993

[54] DYNAMIC RANDOM ACCESS MEMORY

[75] Inventor: Hiroyuki Yamauchi, Takatsuki, Japan

[73] Assignee: Matsushita Electric Industrial Co., Ltd., Osaka, Japan

[21] Appl. No.: 851,293

[22] Filed: Mar. 12, 1992

[30] Foreign Application Priority Data

Mar. 15, 1991 [JP] Japan .................... 3-51582

[51] Int. Cl.⁵ .................... G11C 13/00; G11C 11/40
[52] U.S. Cl. ........................... 365/203; 365/189.01; 365/149
[58] Field of Search .................... 365/203, 205, 189.01, 365/149, 208

[56] References Cited

U.S. PATENT DOCUMENTS

| | | |
|---|---|---|
| 4,112,508 | 9/1978 | Itoh .................... 365/203 |
| 4,893,277 | 1/1990 | Kajigaya et al. .................... 365/203 |

*Primary Examiner*—Terrell W. Fears
*Attorney, Agent, or Firm*—Wenderoth, Lind & Ponack

[57] ABSTRACT

In a dynamic random access memory of precharge type including a plurality of memory arrays, switches provided for a memory array connect one of the common source lines of a sense amplifier with common data lines is always turned on in a non-selected memory array. The switch is kept turned on even in a period wherein the memory array is selected and the sense amplifier is kept active. When the one of the common source lines is connected by the switches, the potential of the one of the common source lines increases and the potentials of the common data lines also increase without a pull-up circuit. The precharge potentials to be supplied to the common source lines may be different from each other. Further, a load circuit may be provided for each memory array for loading the common data lines for reading information when a switch is turned off to isolate the common data lines. Then, the read and write actions can be stabilized.

17 Claims, 14 Drawing Sheets

Fig. 8

DYNAMIC RANDOM ACCESS MEMORY

BACKGROUND OF THE INVENTION

1. Field of the Invention

The present invention relates to a dynamic random access memory (DRAM) of precharge type.

2. Description of the Prior

A bit of memory cell in a dynamic access memory consists of a capacitor for storing image information and a MOS transistor for selecting an address, and a dynamic random access memory includes memory cells arranged around intersections of bit lines and word lines as a matrix. Information of logic "1" or "0" can stored according to the amount of charges existing in the capacitor. The information is read by turning on the MOS transistor at a selected address so as to connect the capacitor to bit lines and by sensing a change in the potential between a pair of bit lines.

Recently, a dynamic random access memory is demanded to have a larger memory capacity, so that the size of a memory cell becomes smaller and a larger number of memory cells is connected to bit lines for sensing. Then, a ratio of the capacitance of the capacitor to the stray capacitance of the bit lines becomes very small and this make the change in the potential to be detected very small.

In order to solve this problem, bit lines are divided or a memory array of the memory cells is divided in the direction of bit lines in order to reduce the number of memory cells connected to bit lines to increase a ratio of the capacitance of the capacitor to the stray capacitance of the bit lines to a desired value. Further, in order to prevent the increase in chip area due to peripheral circuits required by the division, a column selection line or a bit line selection signal line is provided by a column address decoder commonly to each of the divided memory arrays.

However, this structure has a problem. That is, a pair of common data lines are connected to a plurality of pairs of bit lines and it is connected to the selected bit lines for reading or writing information. If a common column address decoder provides a data line selection signal to the bit line selection signal line, a pair of bit lines and the common data lines are connected to each other in the non-selected memory arrays via switches for selecting bit lines. Then, the bit lines keep a half precharge level, while the common data lines has a precharge level higher or lower than the precharge level. Thus, the potential level of the bit lines having a small capacitance varies largely; that is, charges are transferred rapidly, the dissipation current increases and the operating potential of the sense amplifier has a worse sensitivity.

In order to solve this problem, in a dynamic random access memory disclosed in U.S. Pat. No. 4,893,277, a pair of common data lines in the non-selected memory arrays are connected to the common source lines of the transistors for amplification of the sense amplifiers, so that the common data lines are kept at the half precharge level about the same as those of the bit lines. The potentials of the common source lines are kept at the half precharge level by a transistor. Then, the above-mentioned difference of the potential between the bit lines and the common data lines vanish, and the rapid transfer of charges does not happen.

However, in the dynamic random access memory, though the potential of the common data lines in the non-selected memory arrays becomes stable at the half precharge level by connecting the common source lines via switches to the common source line of the sense amplifier, the switches for connecting the common data lines to the common source lines are turned off in the selected memory array. Thus, the potential of the common data lines become floating at the half precharge level, and this may prevent stable read operation after the bit lines are connected to the common data lines.

Then, precharge circuits for pull-up are connected to the common data lines in order to solve this problem. However, the precharge circuits increase the layout area.

Even in this high-precharge scheme, however, the sensing action is not stable. Because the precharge level of the common data lines is $V_{cc}$, if the bit lines are connected to the common data lines according to a bit line selection signal when the amplification of the sense amplifier is not completed, the potential of the higher potential line of the bit lines is nearly amplified. If the bit lines in such a state are suddenly connected to the common data lines at a higher potential, the bit lines of smaller potential difference are attracted to the common data lines at a higher potential difference. This is liable to affect the following amplification action.

Further, a timing to operate the precharge circuit is a larger problem. In order to operate the precharge circuit after the address selection, if the common data lines located near the bit lines are changed rapidly from the precharge level to the $V_{cc}$ level at around a timing when the memory cell is read or when the read action is most liable to be affected by noises, noises may be generated.

However, if the timing is delayed in order to solve the problem, a time is not enough for a change in the potential of the common data lines from the half precharge level to $V_{cc}$, and the bit lines are connected to the common data lines according to a bit line selection signal at a state wherein the potential is lower than the higher potential line of the bit lines. Thus, both bit lines are attracted to the potential of the common data lines having a rather large stray capacitance than the bit lines, and this may affect the following amplification.

SUMMARY OF THE INVENTION

An object of the present invention is to provide a dynamic random access memory cell with a large memory capacity and with a low dissipation current which can act stably.

In a dynamic random access memory according to this invention including a plurality of memory arrays, a switch provided for a memory array for connecting one of the common source lines of a sense amplifier with common data lines is always turned on as in a prior art in a non-selected memory array. Then, the potentials of the common source lines of the sense amplifiers in an inactive state are kept stable at the same level at the precharge level of the bit lines in a non-selected state. Thus, the potential of the common data lines are also stable at the precharge level of the bit lines.

Further, the switch is kept turned on even in a period wherein the memory array is selected and the sense amplifier is kept active. When the one of the common source lines is connected by the switch, the potential of the one of the common source lines increases and the potentials of the common data lines also increase. Therefore, a pull-up circuit only for pulling up the potential of the common data lines to the power supply potential is not needed in the dynamic random access memory.

The precharge potentials to be supplied to the common source lines may be different from each other.

Further, a read and write circuit, provided for each memory array, for reading or writing information from or in the pair of common data lines, includes a switch for connecting the common data lines to each other after information of the bit lines is transferred to the common data lines in the memory array selected according to an address. Further, a load circuit is provided for each memory array for loading the common data lines for reading information when the switch of the read and write circuit is turned off. The load circuit has a constant current driving capacity.

An advantage of the present invention is that the layout area of a dynamic random access memory can be decreased because circuits for pull-up and for pull-down of the common data lines are not needed.

Another advantage of the present invention is that the timing for pull-up and pull-down is not needed because it is determined automatically at the timing for activating the sense amplifier.

BRIEF DESCRIPTION OF THE DRAWINGS

These and other objects and features of the present invention will become clear from the following description taken in conjunction with the preferred embodiments thereof with reference to the accompanying drawings, and in which:

FIG. 8 is a circuit diagram of a read circuit of a random access memory and its peripheral circuit of Example 3;

DETAILED DESCRIPTION OF THE PREFERRED EMBODIMENTS

Figure 1:
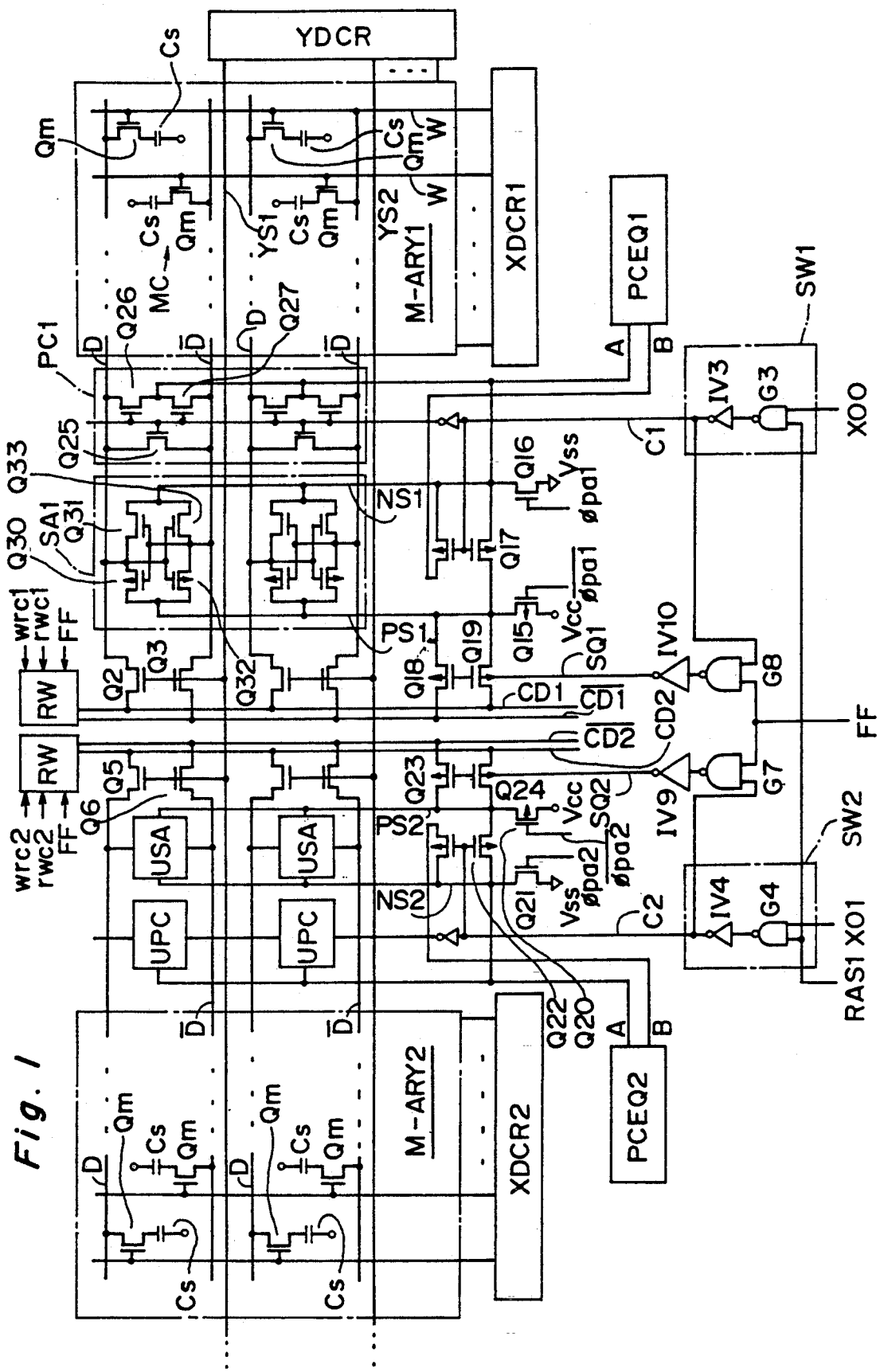
FIG. 1 is a circuit diagram of a read circuit of a random access memory of Example 1 and its peripheral circuit.

Referring now to the drawings, wherein like reference characters designate like or corresponding parts throughout the several views, several Examples of the present invention will be explained below.

EXAMPLE 1

Figure 2:
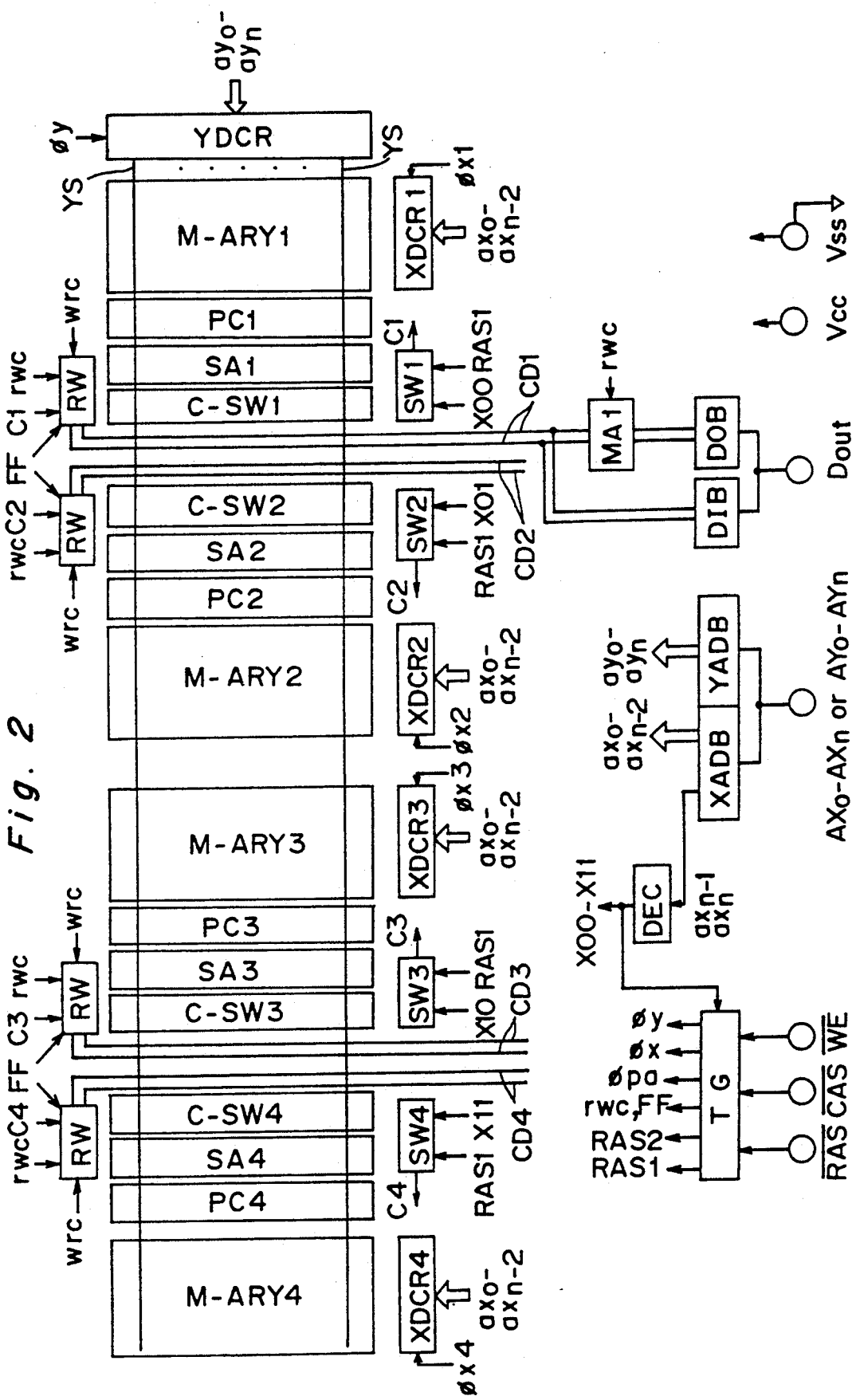
FIG. 2 is a block diagram of the read circuit shown in FIG. 1 and its peripheral circuit.
Figure 3A:
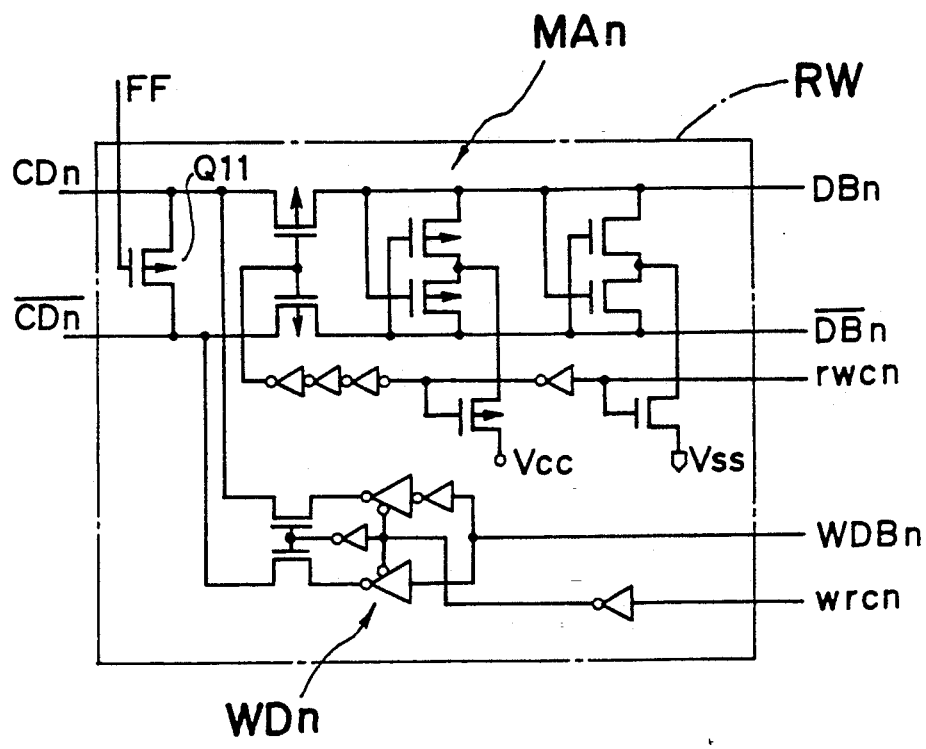
FIG. 3(a) is a circuit diagram of a main amplifier of the dynamic random access memory shown in FIG. 1
Figure 3B:
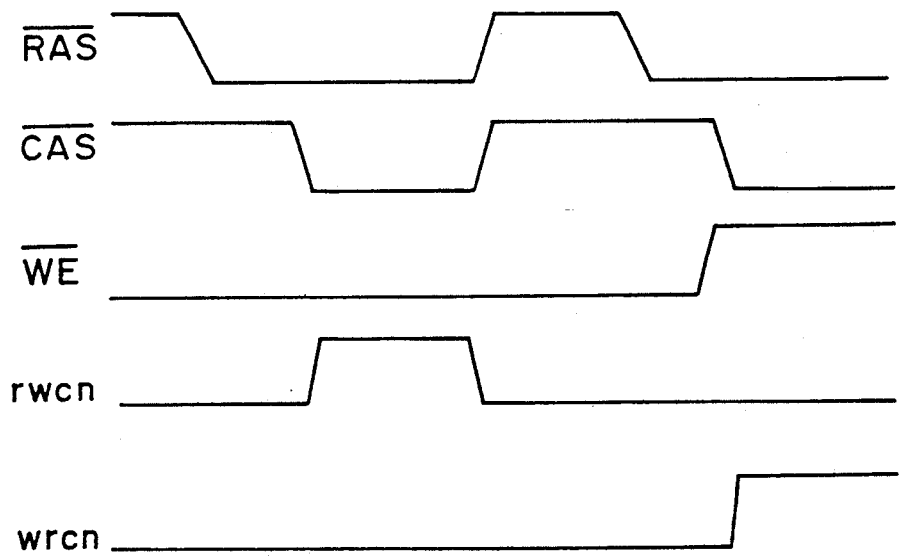
FIG. 3(b) is a timing chart of the main amplifier.

FIG. 1 shows a circuit diagram of a read circuit of a dynamic random access memory and its peripheral circuit of Example 1; FIG. 2 shows a block diagram of the read circuit; and FIG. 3(a) shows a circuit diagram of a main amplifier of the dynamic random access memory and FIG. 3(b) shows a timing chart of the main amplifier. In those Figures, "Q1"-"Q25" designate MOS transistors. "$V_{cc}$" designates a power supply potential, and "$V_{ss}$" designates a ground potential.

In the dynamic random access memory, memory cells are divided in four memory arrays M-ARY1-M-ARY4 in a direction of bit lines D, $\overline{D}$ multiply. A memory cell MC consists of a capacitor Cs for storing information and a MOS transistor for selecting an address. A plurality of memory cells MC are arranged at intersections of bit lines D, $\overline{D}$ and word lines W as a matrix into the memory arrays M-ARY1-M-ARY4.

A column address decoder YDCR is a circuit for connecting a pair of bit lines to common data lines according to a common data line selection line. It decodes a Y address $ay_0$-$ay_n$ derived from a column address $AY_0$-$AY_n$ and provides a bit line selection signal to signal lines YSn (YS1 and YS2) used commonly for the four memory arrays M-ARY1-M-ARY4.

On the other hand, four row address decoders XDCR1-XDCR4 are circuits for selecting a word line in a memory array wherein a memory cell to be selected according to an address exists. They are provided for the four memory arrays M-ARY1-M-ARY4, decodes an X address $ax_0$-$ax_n$ derived from a column address $AX_0$-$AX_n$ and supplies a word signal to the word lines W for selecting a word line W for turning a MOS transistor Qm on. A bit selection signal generated by the column address decoder YDCR is given to the bit line selection signal lines YSn and is used to connect the bit lines Dn, $\overline{Dn}$ to common data lines CDn, $\overline{CDn}$ connected to a read-write circuit RW.

A sense amplifier SA1-SA4 provided for the four memory arrays M-ARY1-M-ARY4 is a circuit for amplifying the signal of the word line selected by a word line selection line. It is connected to the bit lines D, $\overline{D}$ and amplifies the potential difference between the bit lines D and $\overline{D}$. It is constructed as a unit USA including P channel transistors Q30 (Qp1), Q32 (Qp2) and N channel transistors Q31 (Qn1), Q33 (Qn2) for flip-flop (refer FIG. 4). The threshold voltage of the P channel transistors $Q_{p1}$, $Q_{p2}$ is $V_{tp}$, while that of the N channel transistors $Q_{n1}$, $Q_{n2}$ is $V_{tn}$. The MOS transistors Q30-Q33 are controlled by common source lines NS1, PS1.

A column selector C-SW1-C-SW4 is connected between the bit lines D, $\overline{D}$ and the common data lines CDn, $\overline{CDn}$. For example, the column switch C-SW1 consists of switches Q2 and Q3, while the column switch C-SW2 consists of switches Q5 and Q6. The column selector C-SWn selects bit lines D, $\overline{D}$ to be connected to the common data lines CDn, $\overline{CDn}$ according to a signal line YSn connected to the common column address decoder YDCR.

A read-write circuit RW, connected to the common data lines CDn, $\overline{CDn}$ (CD1, $\overline{CD1}$, CD2, $\overline{CD2}$), consists of a main amplifier MAn and a write circuit WDn for reading and writing a data in the common data lines CDn, $\overline{CDn}$. (In FIG. 2, the main amplifier is illustrated beside the read-write circuit RW.) The main amplifier MAn amplifies the difference between the potentials of the bit lines D, $\overline{D}$ in a read cycle. As shown in FIG. 3(a), the main amplifier MAn, activated by a timing signal rwcn (rwc1, rwc2), receives a signal from the common data line CDn, $\overline{CDn}$ and sends a data via the data lines DBn, $\overline{DBn}$. The write circuit WDn, activated by a timing signal wrcn, receives a signal of the data line WDBn and sends a signal of the common data lines CDn, $\overline{CDn}$. The read-write circuit RW has a switch Q11 connected between the common data lines CDn, $\overline{CDn}$, and the switch Q11 connects them after information is transferred from a selected pair of bit lines D, $\overline{D}$ the common data lines under the control of an equalizing signal FF.

FIG. 3(b) shows the relation of the timing signals rwcn, wrcn and external signals $\overline{RAS}$, $\overline{CAS}$, $\overline{WE}$. The dynamic random access memory is controlled in a read cycle and in a write cycle as shown in FIG. 3(b).

Further, as shown in FIG. 2, following blocks are provided for each memory array M-ARY1–M-ARY4: A timing generator TG generates various signals. A selector SWn selects the sense amplifier SAn for a memory array M-ARYn to be activated. A precharger PCn precharges bit lines D, $\overline{D}$.

A timing generator TG generates a row address strobe signal RAS1, RAS2, a write signal rwc, an equalizing signal FF or the like from external signals $\overline{WE}$, $\overline{RAS}$ and $\overline{CAS}$. "X00", "X01", "X10" and "X11" designate decode lines for selectors SW1–SW4. "RAS1" and "RAS2" designate an inverted signal of the row address strobe signal $\overline{RAS}$. This timing signal is not activated in a write cycle.

A selector SW1–SW4 each provided for the four memory arrays M-ARY1–M-ARY4 supplies a memory array selection signal C1–C4 both to the sense amplifiers SA1–SA4 and to the prechargers PC1–PC4. For example, the selector SW1 consists of a NAND gate G3 and an inverter IV3, while the selector SW2 consists of a NAND gate G4 and an inverter IV4. The selectors SW1, SW2 generate memory array selection signals C1, C2 determined according the decode lines X00, X01 and the internal signal RAS1 of row address strobe signal $\overline{RAS}$ and selects only one sense amplifier SAn for a memory array to be selected in order to lower the dissipation current.

A precharger PC1–PC4 is a circuit for precharging the bit lines D, e,ovs/D/, and it is provided for the four memory arrays M-ARY1–M-ARY4 for precharging the bit lines D, e,ovs/D/ are constructed as a unit UPC including switches Q25, Q26 and Q27 of MOS transistors and are connected to the bit lines D, e,ovs/D/ and to a selection signal line Cn. The switches Q25, Q26 and Q27 equalize the bit lines D and e,ovs/D/ and precharge the latters at the half precharge level, as will be explained later.

In FIG. 1, "NS1" and "NS2" designate common source lines of N channel MOS transistors and "PS1" and "PS2" designate common source lines of P channel MOS transistors in sense amplifiers SA1, SA2.

The common source lines NS1, PS1, and NS2, PS2 for the sense amplifiers SA1, SA2 are controlled by activation signals $\phi_{pa1}$ and $\overline{\phi}_{pa1}$, and $\phi_{pa2}$ and $\overline{\phi}_{pa2}$ determined by a NAND gate receiving an activation signal $\phi_{pa}$ and the memory array selection signals C1, C2. Switches Q15, Q16, Q20 and Q21 of MOS transistors control the potential of the common source lines PS1, NS1, PS2, NS2 according to output signals (activation signal) $\phi_{pa1}$, $\overline{\phi}_{pa1}$, and $\phi_{pa2}$, $\overline{\phi}_{pa2}$ of the selector SW1 and SW2.

The common source lines NS1 and PS1, and NS2 and PS2 are connected to each other via MOS transistors Q17, Q20 which are controlled by the memory array selection signal C1, C2, respectively.

An equalizing signal FF is provided to the read-write circuit RW and to NAND gates G8, G7. The selection signals C1, C2 are also to the NAND gate G3, G4, and the output SQ1, SQ2 of the NAND gate G3, G4 are connected via an inverter IV9, IV10 to the switches Q18, Q19.

The switches Q18, Q19 connect the common source line PS1 to the common data lines CD1, $\overline{CD1}$ for equalizing under the control of a signal line SQ1. An equalizing signal FF and a selection signal C1 from the selector SW1 are sent to a NAND gate G8 and the output signal of the NAND gate G8 is supplied to the signal line SQ1 via an inverter IV10. Then, the switches Q18, Q19 connect the common source line for providing a voltage $V_{cc}$ necessary for amplification to the common data lines CD1, $\overline{CD1}$ for the selected memory array in the selection period as well as in the non-selection period.

Figure 5A:
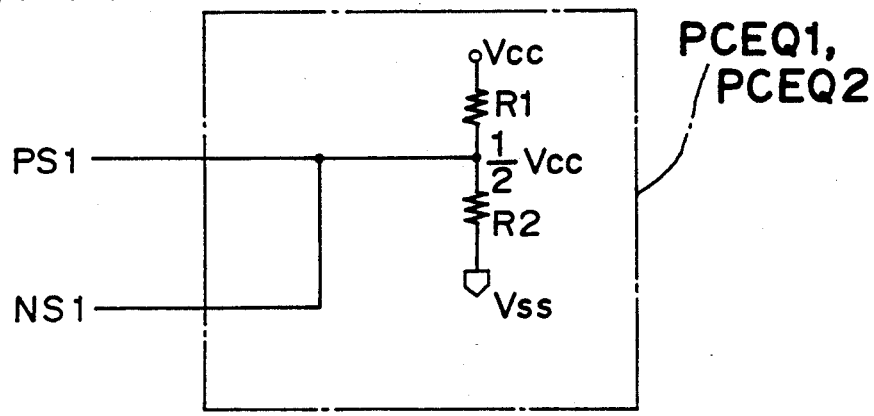
FIG. 5(a) is a circuit diagram of prechargers PCEQ1 and PCEQ2 in the dynamic random access memory of Example 1.

Prechargers PCEQ1, PCEQ2 are circuits for precharging the sense amplifier SAn in the non-selection period. As shown in FIG. 5(a), the prechargers PCEQ1, PCEQ2 divide the external power supply potential $V_{cc}$ with resistances R1, R2 to get the half precharge level $V_{cc}/2$ and provide it to the bit lines D, $\overline{D}$ via the precharger PC1, PC2 and to the common source lines NS1, NS2 via a MOS transistor Q17'. The timing of the precharging of the common source line NS1, NS2 is controlled by the selection signal C1, C2, or the bit lines D, $\overline{D}$ are precharged when the memory array M-ARYn is not selected. Though the voltage is divided by resistances in this Example, the potential may be divided with transistors. Further, the precharge level is not limited to $V_{cc}/2$.

Figure 6A:
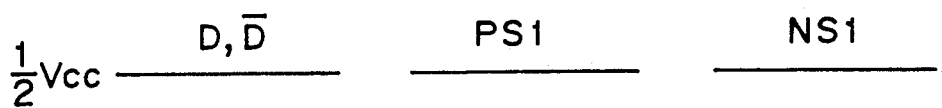
FIG. 6(a) is a diagram of the precharge potential of the bit lines D, $\overline{D}$ and of the common source lines NS1, PS1 in FIG. 5(a)

FIG. 6(a) shows the state of the precharge levels of the bit lines D, $\overline{D}$ and the common source lines NS1 and PS1 in Example 1.

Figure 7A:
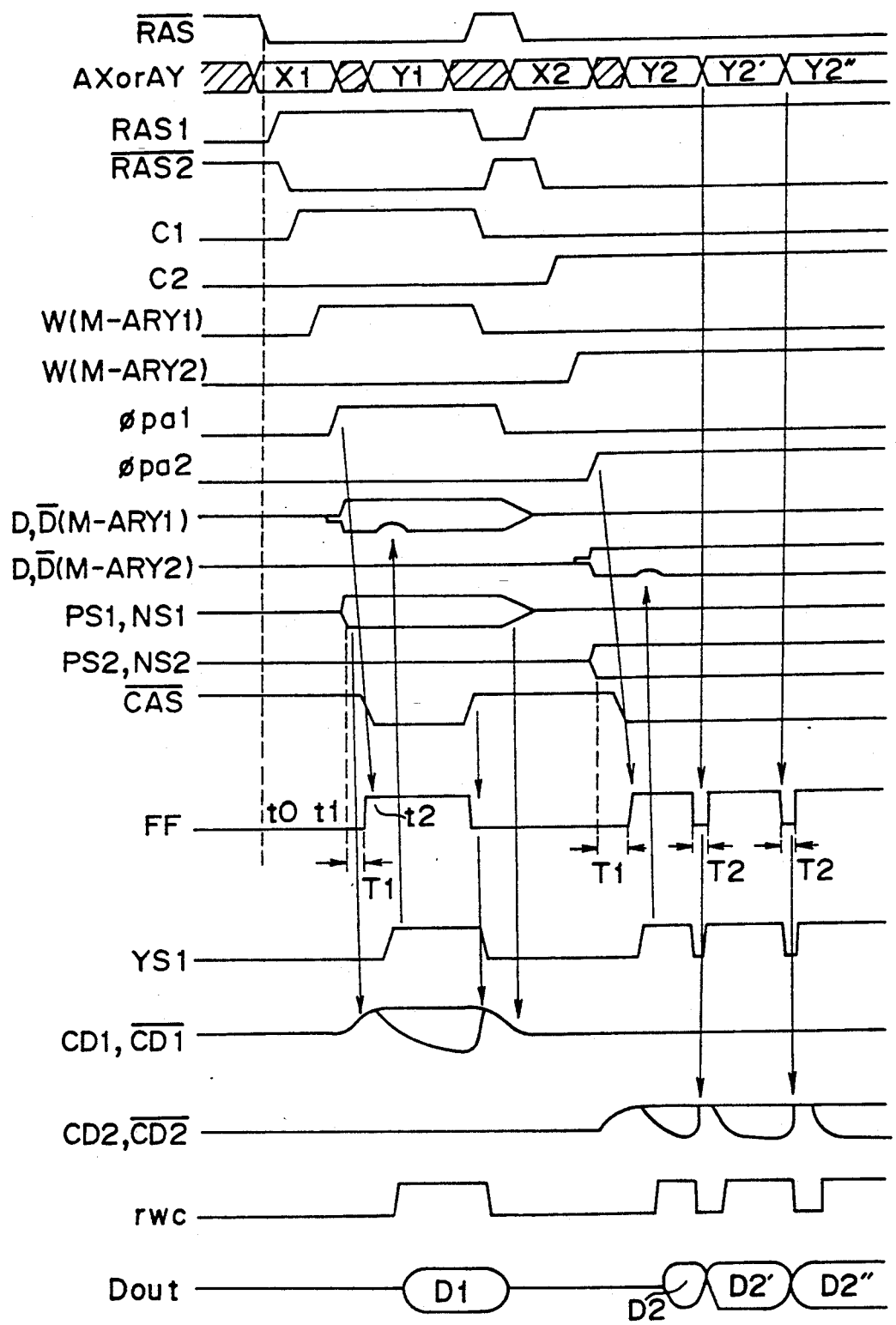
FIG. 7(a) is a timing chart of the dynamic random access memory of Example 1.

FIG. 7(a) shows a timing chart of the above-mentioned dynamic random access memory in Example 1. In FIG. 7(a) "t0" designates a timing when the row strobe signal $\overline{RAS}$ becomes the low level, "t1" designates a timing for activating the sense amplifier SAn, and "t2" designates a timing when an equalizing signal FF becomes the low level from the high level. Further, "T1" means the time difference between t1 and t2 or the time difference till a read of sense amplifier information is started according to column information after the sense amplifier is activated, and "T2" means a time when the levels of the lines PS1, CD1 are equalized to each other.

A characteristic of Example 1 is that the switches Q18 and Q19 for connecting the common data lines CD1, $\overline{CD1}$ to the common source line PS1 of the sense amplifier SA1 are not controlled only by the selection signal C1. That is, the switches Q18 and Q19 are controlled by a signal SQ1, SQ2 determined not only by the selection signal C1 of the selector SW1 of the memory array M-ARY1 but also by an equalizing signal FF of the common data lines CD1, $\overline{CD1}$ supplied via the NAND gate G8. In the memory shown in FIG. 1, the common source line PS1 and the common data line CD1 are connected to each other even after the row address strobe signal $\overline{RAS}$ becomes low as far as the equalizing signal FF is low.

The equalizing signal FF is a signal for connecting the common data lines CD1 and CD2 when FF is low. The equalizing signal FF is generated by the timing generator TG provided in the DRAM chip as shown in FIG. 2. As shown in FIG. 7(a), the signal FF is not directly related to the start of an ordinary cycle or to the row address strobe signal $\overline{RAS}$, but is controlled by the column address strobe signal $\overline{CAS}$. Further, the equalizing signal FF is also controlled according to a change in the column address signal AY.

Figure 7B:
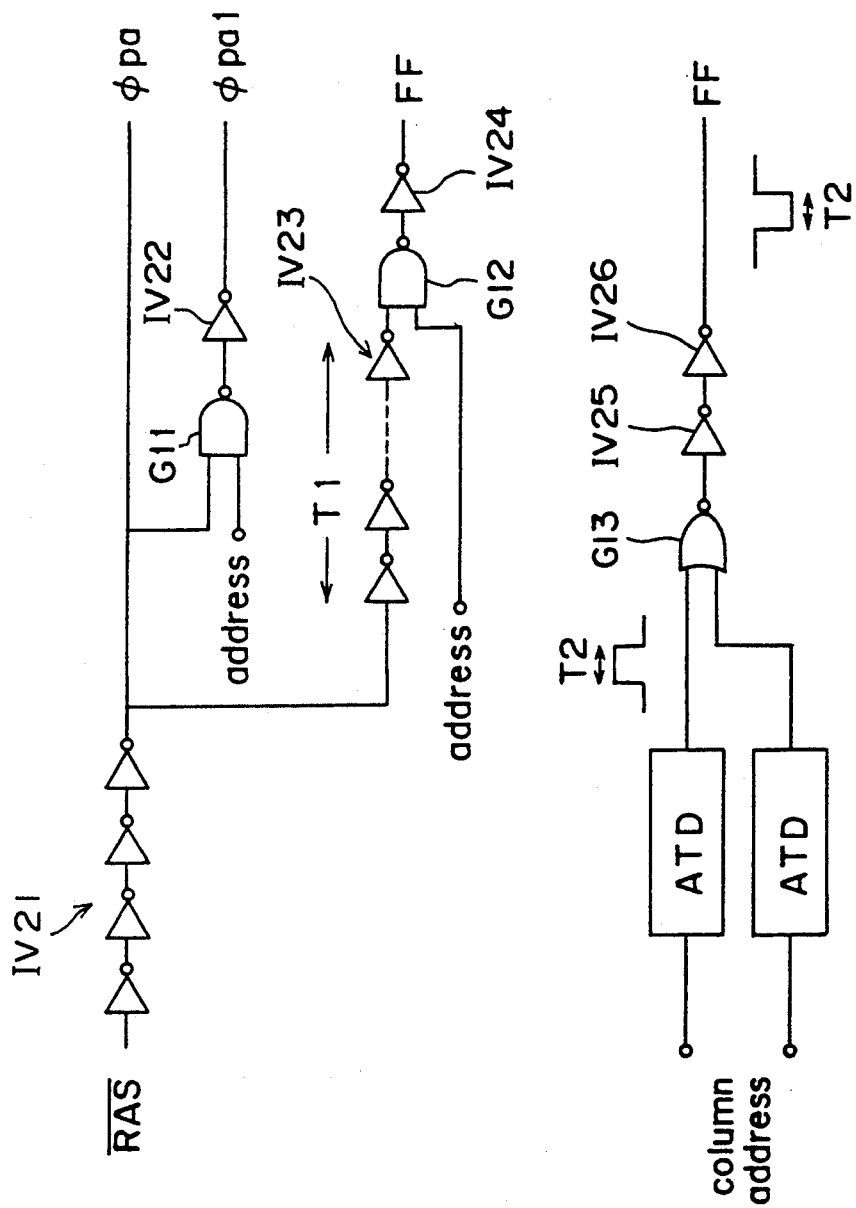
FIG. 7(b) is a block diagram of a part of a timing generator.

FIG. 7(b) shows a part of the timing generator TG with reference to the generation of the equalizing signal FF. The row address strobe signal $\overline{RAS}$ are outputted via four inverters IV 21 as a sense amplifier activation signal $\phi_{pa1}$. The output of the four inverters IV 21 as well as an address signal is also received by a NAND gate G11. The output of the NAND gate G11 is sent via an inverter IV22 as a signal $\overline{\phi_{pa1}}$ which means the selection of the respective memory array. Further, the output of the four inverters IV 21 is delayed via a plurality of inverters IV 23 by T1, and the delayed signal as well as the address signal are received by a NAND gate G12, and the output of the NAND GATE G12 is sent via an inverter IV 24 as an equalizing signal FF.

Further, two column address signals are supplied to address transfer detectors ATD for delay of T2, and the outputs of ATD are sent via a NOR gate G13 and two inverter IV 25, IV26 as an equalizing signal FF.

Then, the common data lines CD1, $\overline{CD1}$ are equalized to each other in the following conditions:

1. When the $\overline{RAS}$ signal is the high level
 (or the RAS1 signal is the low state).
 2. After the $\overline{RAS}$ signal becomes the low level ($t_o$), till a column address AY is fetched to make the peripheral circuit for column to be at the start state (t2 delayed by T1 from t1).
 (In a prior art ordinary mode, till the $\overline{CAS}$ signal becomes the low level. However, in a DRAM having a static column mode function, till a signal to fetch the column address AY is generated internally or till the peripheral circuit for column is started.)
 3. When the column address AY is changed.
 (In a DRAM having a static column mode function, when the column address is generated, the peripheral circuit for column is started).

As shown in FIG. 7(a), when the row address strobe signal $\overline{RAS}$ becomes a low level, the row address strobe signal RAS1 as an inverted signal $\overline{RAS}$ becomes a high level. Thus, even when the output of the selector SW1 for the memory array M-ARY1 or the selection signal C1 of the memory array M-ARY1 becomes a high level, the switches Q18, Q19 for connecting the common data lines CD1, $\overline{CD1}$ of the selected memory array M-ARY1 to the common source line PS1 of the sense amplifier SA1 are not turned off readily. On the contrary, in a prior art memory disclosed in U.S. Pat. No. 4,893,277, when the row address strobe signal $\overline{RAS}$ becomes a low level, the row address strobe signal RAS1 becomes at the high level and the selection signal C1 for selecting the memory array M-ARY1 becomes a high level. Thus, the switches Q18, Q19 are turned off readily, because the switches Q18, Q19 in the prior art memory in correspondence to the switches Q18, Q19 of Example 1 are controlled only by the selection signal C1.

As explained above, the switches Q18, Q19 are not turned on as soon as the row address strobe signal $\overline{RAS}$ becomes a low level. After the address strobe signal $\overline{RAS}$ becomes a low level, the sense amplifier SA1 in correspondence to the memory array selection signals $\phi_{pa1}$, $\overline{\phi_{pa1}}$ is activated and the potential at the common source line PS1 increases from the precharge level to the $V_{cc}$ level eventually. Then, as shown in FIG. 7(a), the potentials of the common data lines CD1, $\overline{CD1}$ increase naturally from the precharge level to $V_{cc}$ through the switches Q18, Q19 which are kept turned on. Therefore, a pull-up circuit is not needed. Then, After the equalizing signal FF becomes a high level, the switches Q18, Q19 are turned off and the potential of the common data line $\overline{CD1}$ is attracted to the ground level gradually. When the equalizing signal FF becomes a low level again when the memory array M-ARY1 is selected, the switches Q18, Q19 are turned on and the potential of the common data line $\overline{CD1}$ is equalized again to that of the common data line CD1 readily.

Further, it is to be noted that the timing for increasing the potentials of the common data lines CD1, $\overline{CD1}$ from the precharge level to the $V_{cc}$ level is determined naturally by the timing to activate the sense amplifier SA1. Therefore, the timing does not affect badly on the amplification thereafter.

In this circuit, the common data lines CD1 and $\overline{CD1}$ are pulled up by using the potential of the common source line PS1 of the PMOS transistors of the sense amplifier SA1, so that the common data lines CD1, $\overline{CD1}$ having a potential equal to or higher a little than the potential at the higher side of the bit lines D, $\overline{D}$ are connected to the bit lines D, $\overline{D}$. Therefore, even if the bit lines D, $\overline{D}$ are combined to the common data lines CD1, $\overline{CD1}$ according to the bit line selection signal of the bit line selection signal line YS1 selected by the common column address decoder YDCR, this affects the potential of the bit lines D, $\overline{D}$ only a little, as shown in FIG. 7(a) on the potential of the bit line $\overline{D}$, and affects also the amplification of the sense amplification SA1 a little thereafter.

EXAMPLE 2

Figure 5B:
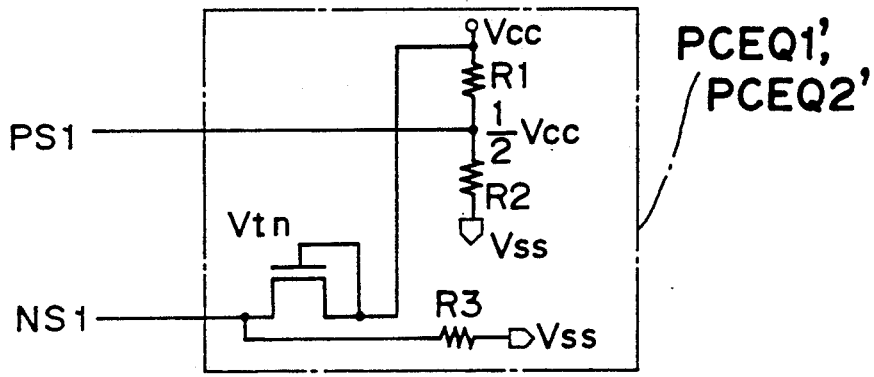
FIG. 5(b) is a circuit diagram of prechargers PCEQ1 and PCEQ2 in a dynamic random access memory cell of Example 2.
Figure 6B:
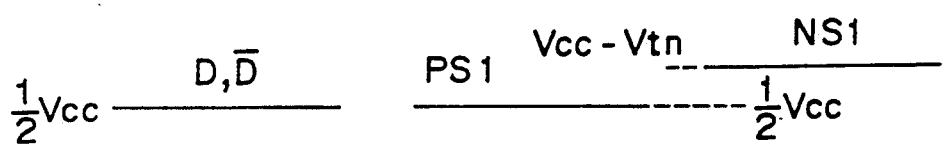
FIG. 6(b) is a diagram of the precharge potential of the bit lines D, $\overline{D}$ and of the common source lines NS1, PS1 in FIG. 5(b)

A dynamic random access memory of Example 2 is mainly the same as that of Example 1 described previously, and only the differences from Example 1 will be explained below. This Example differs from Example 1 only as to prechargers PCEQ1', PCEQ2', shown in FIG. 5(b), for precharging the bit lines D, $\overline{D}$ and the common source lines NS1, PS1. FIG. 6(b) shows the state of the precharge potential of the bit lines D, $\overline{D}$ and the common source lines NS1, PS1.

In the prechargers, the common source line PS1 of the PMOSFETs of the sense amplifier SA1 is precharged at the potential which is the same as the bit lines D, $\overline{D}$, while the common source line NS1 of the NMOSFETs of the sense amplifier SA1 is precharged at a potential different from that of the bit lines D, $\overline{D}$. This is in contrast to the precharges PCEQ1, PCEQ2 in Example 1 which precharge both common source lines NS1, PS1 at the same level.

The potential different from that of the bit lines D, $\overline{D}$ is for example a level larger than the precharge level ($V_{cc}/2$) of the bit lines D, $\overline{D}$. In the circuit shown in FIG. 5(b), an NMOS transistor and a resistance R3 are connected in series between $V_{cc}$ and $V_{ss}$, and the common source line NS1 is connected to between them. Then, the potential supplied to the common source line NS1 is $V_{cc}-V_{tn}$, wherein $V_{cc}/2 > V_{tn}$; "$V_{tn}$" designates the threshold voltage of the NMOS transistor.

By setting the precharge level of the common source line NS1 higher than the potential of the bit lines D, $\overline{D}$, a problem explained below can be solved.

Figure 4:
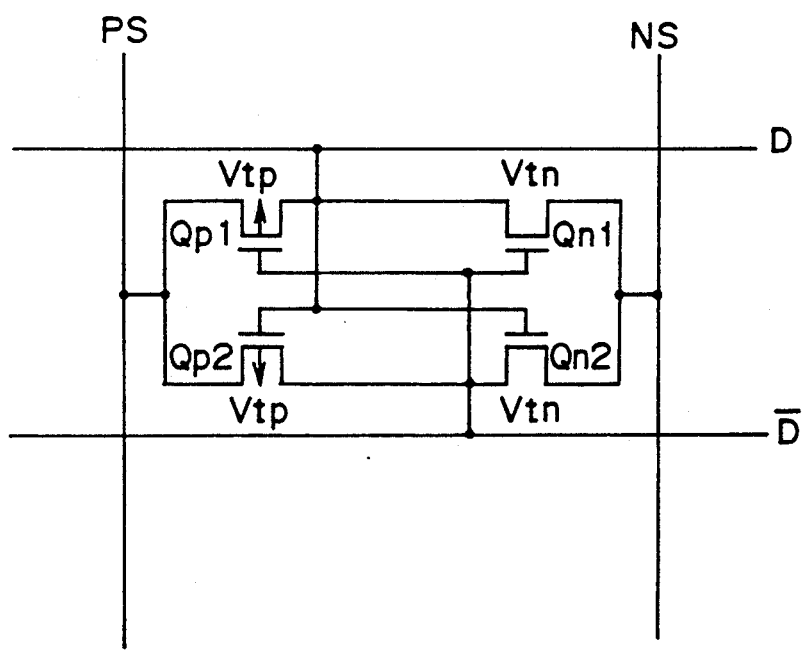
FIG. 4 is a circuit diagram of a sense amplifier SAn.

If the activation voltage of a dynamic random access memory is required in the future to be lowered in order to increase reliability or to decrease the dissipation power in the future, it is necessary to make the threshold voltage $V_{tn}$ of the NMOS transistor $Q_{n1}$, $Q_{n2}$ of the sense amplifier shown in FIG. 4 very small ($V_{tn} < -0.1$ V) in order to secure the amplification rate of the sense amplifier. However, if the common source lines NS1 is precharged at the same potential as the bit lines D, $\overline{D}$, the NMOS transistors $Q_{n1}$, $Q_{n2}$ are turned on because the threshold voltage $V_{tn}$ is low and the sense amplifier starts amplification before information is read from a memory cell to the bit lines or a normal read operation is not conducted. On the other hand, because the common source line NS1 in Example 2 is precharged at a level higher than the precharge level ($V_{cc}/2$) of the bit lines D, $\overline{D}$ in Example 2, the NMOS transistors $Q_{n1}$, $Q_{n2}$ are not turned on if the threshold voltage $V_{tn}$ is low.

EXAMPLE 3

Figure 8:
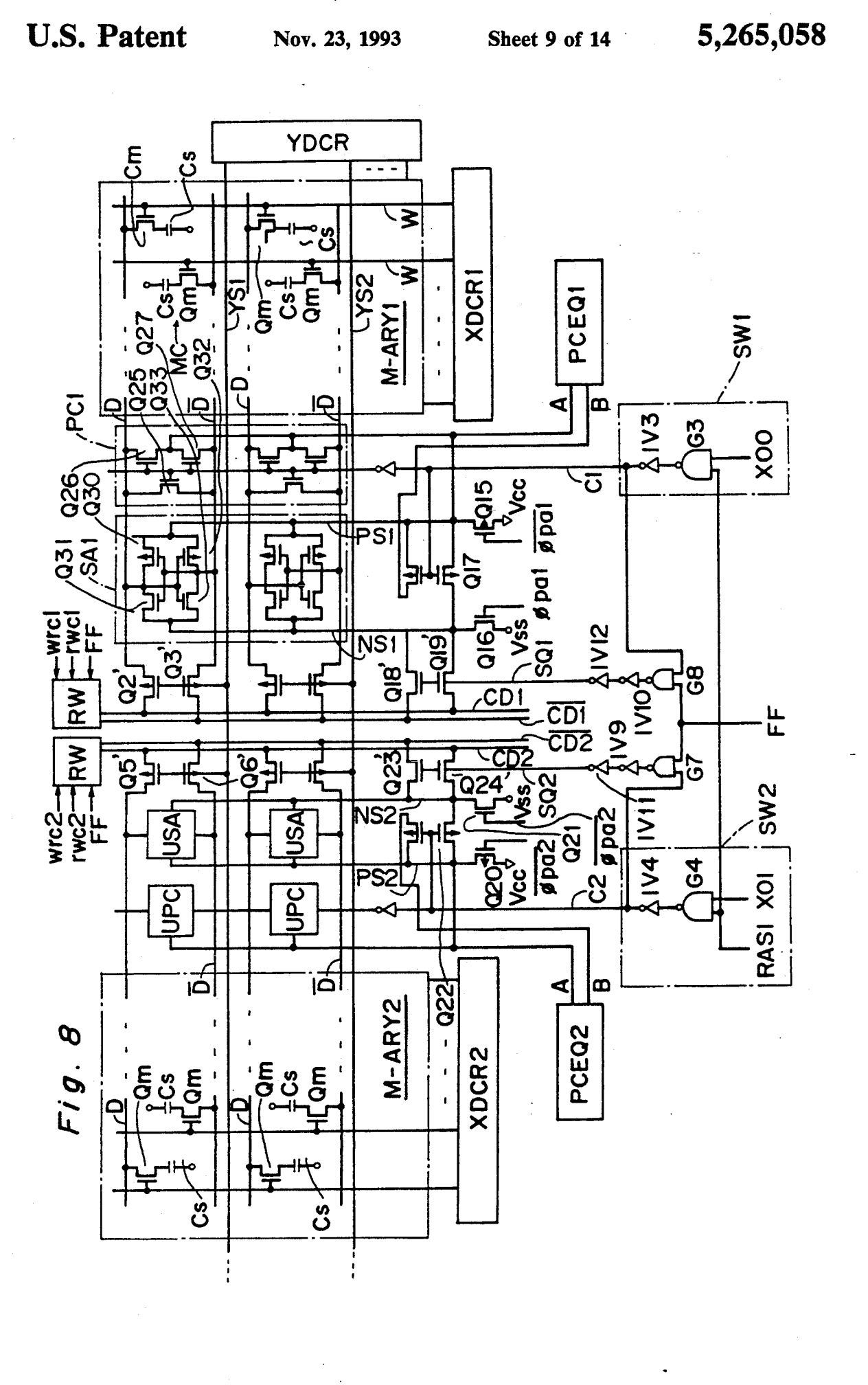

A dynamic random access memory of Example 3 is mainly the same as that of Example 1, and only the difference from Example 1 will be explained below. FIG. 8 shows a circuit diagram of a read circuit of a random access memory and its peripheral circuit of this Example, and FIG. 9 shows a timing chart of the dynamic random access memory shown in FIG. 8.

As shown in FIG. 8, the common source line NS1 of the NMOS transistors of the sense amplifier SA1 is connected to the common data lines CDn, $\overline{CDn}$ with switches Q18', Q19', Q23', Q24', of NMOS transistors. On the other hand, in Example 1, the common source line PS1 of the PMOS transistors of the sense amplifier SA1 is connected to the common data lines CDn, $\overline{CDn}$ with the switches Q18, Q19, Q23, Q24 of NMOS transistors. Further, PMOSFETs Q2', Q3', Q5', Q6', correspond with the NMOSFETs of the counterparts in Example 1. The transistors Q15 and Q16 are connected to the ground potential and to the power supply potential $V_{cc}$, and are controlled by memory array selection signals $\phi_{pa1}$, $\overline{\phi_{pa1}}$. Further, inverters INV12, INV11 are connected between the inverters IV10, INV9 and the transistors Q18', Q19' and Q23' and Q24'.

Figure 9:
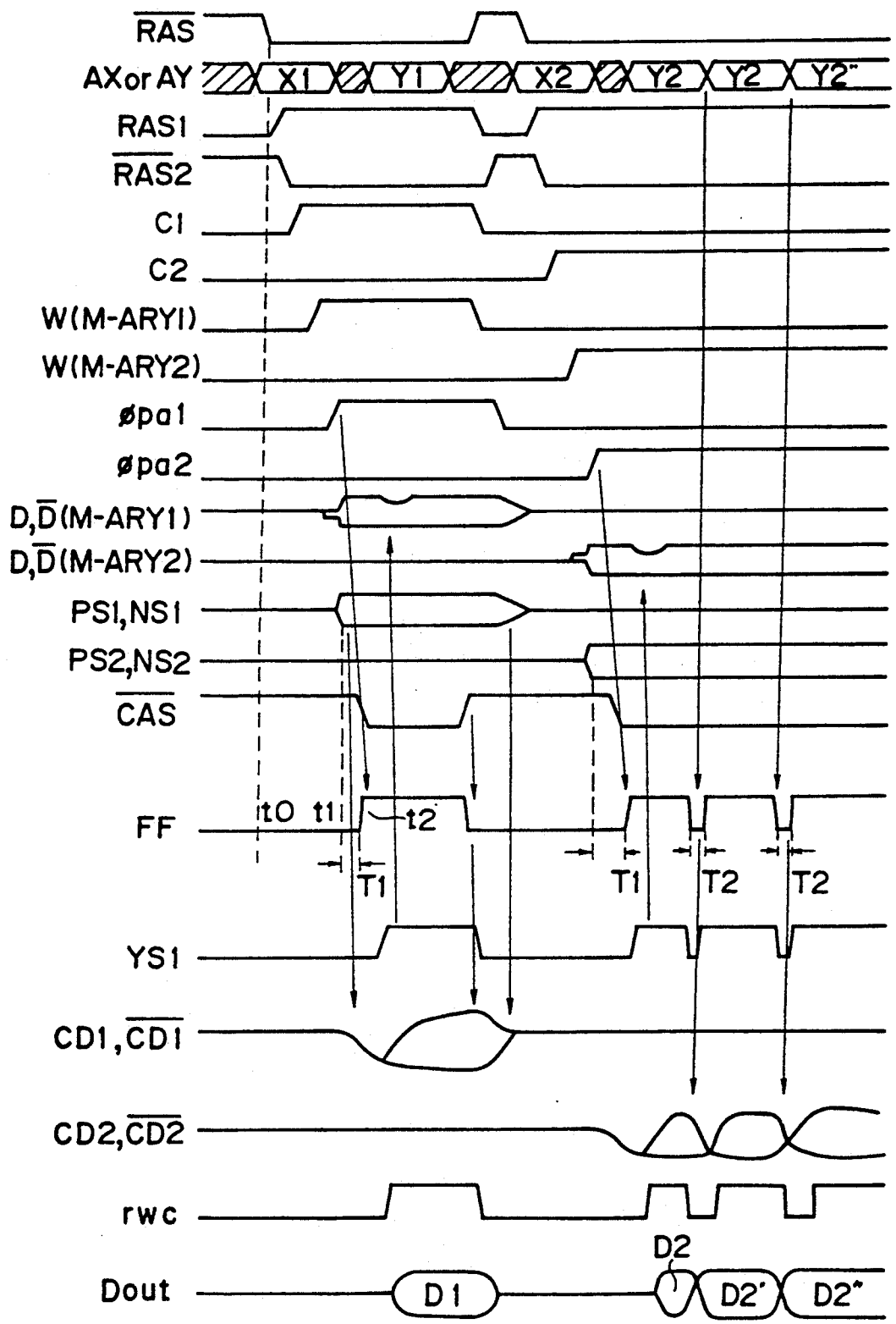
FIG. 9 is a timing chart of the dynamic random access memory shown in FIG. 8.

As shown in FIG. 9, the action is the same mainly as that in Example 1 shown in FIG. 7(a), except the wave forms of the potentials of the bit lines D, $\overline{D}$ and the common data lines CD1, $\overline{CD1}$, CD2, $\overline{CD2}$. It is clear in FIG. 9 that the potentials of the common data lines CD1, $\overline{CD1}$, CD2, $\overline{CD2}$ vary according to the data of the bit lines D, $\overline{D}$.

A pull down circuit including a selection circuit of memory cell and a timing circuit for pull-down are not needed in Example 3, as in Example 1.

Further, Example 3 has an advantage explained below. In order to make fast the timing for turning the MOS transistor $Q_m$ on in response to the rise of the word line W for word selection, if the precharge level of the bit lines D, $\overline{D}$ is made lower than an ordinary value $V_{cc}/2$ to $V_{cc}/3$, $V_{cc}/4$ or the like, the operation voltage of the latch circuit of the NMOS transistors in the sense amplifier of CMOS transistors becomes extremely low so that a normal operation becomes impossible. Thus, the latch circuit is mainly operated by the PMOS transistors. When a data is transferred via the switches Q2', Q3', Q4' and Q5' of PMOS transistors to the common data lines CD1, $\overline{CD1}$ in such a latch circuit preferring the PMOS transistors, the change in the potentials of the common data lines CD1, $\overline{CD1}$ becomes larger when the precharge potential for the common data lines CD1, $\overline{CD1}$ is set at a low precharge level than at a high precharge level.

If the integration and the density of a dynamic random access memory are increased further in the future, a read circuit by using a low precharge potential will become important in order to access a dynamic random access memory at a high rate while securing the reliability of the device and decreasing the dissipation power. Then, the circuit of Example 3 is effective in this point.

EXAMPLE 4

Figure 5C:
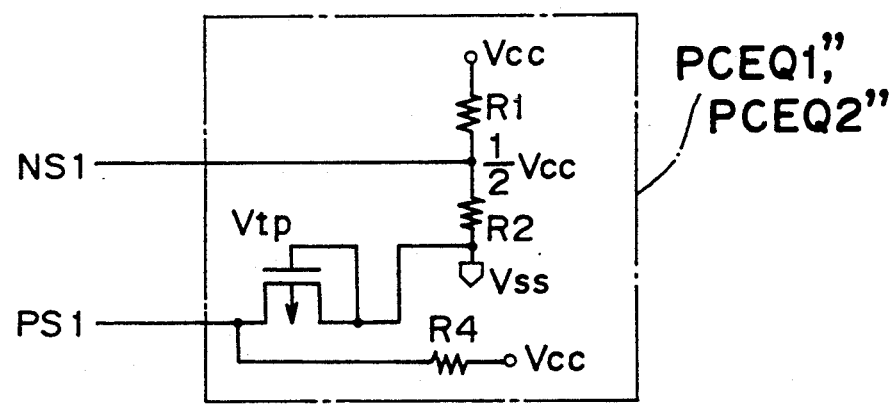
FIG. 5(c) is a circuit diagram of prechargers PCEQ1 and PCEQ2 in a dynamic random access memory cell of Example 4.
Figure 6C:
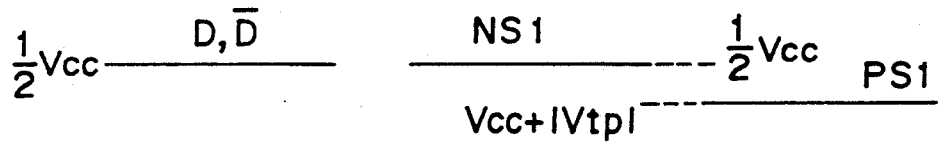
FIG. 6(c) is a diagram of the precharge potential of the bit lines D, $\overline{D}$ and of the common source lines NS1, PS1 in FIG. 5(c)

A dynamic random access memory of Example 4 is mainly the same as that of Example 3 described previously, and only differences from Example 3 will be explained below. This Example differs from Example 3 only as to prechargers PCEQ1″, PCEQ2″, shown in FIG. 5(c), for precharging the bit lines D, $\overline{D}$ and the common source lines NS1, PS1, NS2, PS2. FIG. 5(b) shows the state of the potentials of the bit lines D, $\overline{D}$ and of the precharge potentials of the common source lines NS1, PS1, while FIG. 6(c) shows the state of the precharge potentials of the bit lines D, $\overline{D}$ and the common source lines NS1, PS1.

In this circuit of the prechargers PCEQ1″ and PCEQ2″, the common source line NS1 of the NMOSFETs of the sense amplifier SA1 is precharged at the potential which is the same as the bit lines D, $\overline{D}$, while the common source line PS1 of the PMOSFETs of the sense amplifier SA1 is precharged at a potential different from that of the bit lines D, $\overline{D}$. This is in contrast to the prechargers PCEQ1, PCEQ2 shown in FIG. 5(a) (Example 1) which precharge both common source lines NS1, PS1 at the same level.

The potential different from that of the bit lines D, $\overline{D}$ is for example a level smaller than the precharge level ($V_{cc}/2$) of the bit lines D, $\overline{D}$. In the circuit shown in FIG. 5(c), a FMOS transistor and a resistance R4 are connected in series between $V_{ss}$ and $V_{cc}$, and the common source line PS1 is connected between them. Then, the potential supplied to the common source line PS1 is $V_{cc}+|V_{tp}|$, wherein $V_{cc}/2 > |V_{tp}|$; "$V_{tp}$" designates the threshold voltage of the PMOS transistor.

By setting the precharge level of the common source line PS1 lower than the potential of the bit lines D, $\overline{D}$, a problem to be explained below can be solved.

If the activation voltage of a dynamic random access memory is required to be lowered in the future in order to increase reliability or to decrease the dissipation power, it is necessary to make the threshold voltage $V_{tp}$ of the NMOS transistor $Q_{p1}$, $Q_{p2}$ of the sense amplifier shown in FIG. 4 very small ($|V_{tp}| < -0.1$ V) in order to secure the amplification rate of the sense amplifier. However, if the common source lines PS1 is precharged at the same potential as the bit lines D, $\overline{D}$, the PMOS transistors $Q_{p1}$, $Q_{p2}$ are turned on because the threshold voltage $V_{tp}|$ is low and the sense amplifier starts amplification before information is read from a memory cell to the bit lines or a normal read operation is not conducted. On the other hand, because the common source line PS1 is precharged at a level lower than the precharge level ($V_{cc}/2$) of the bit lines D, $\overline{D}$ in Example 4, the PMOS transistors $Q_{p1}$, $Q_{p2}$ are not turned on if the threshold voltage $V_{tp}$ is low.

EXAMPLE 5

Figure 10:
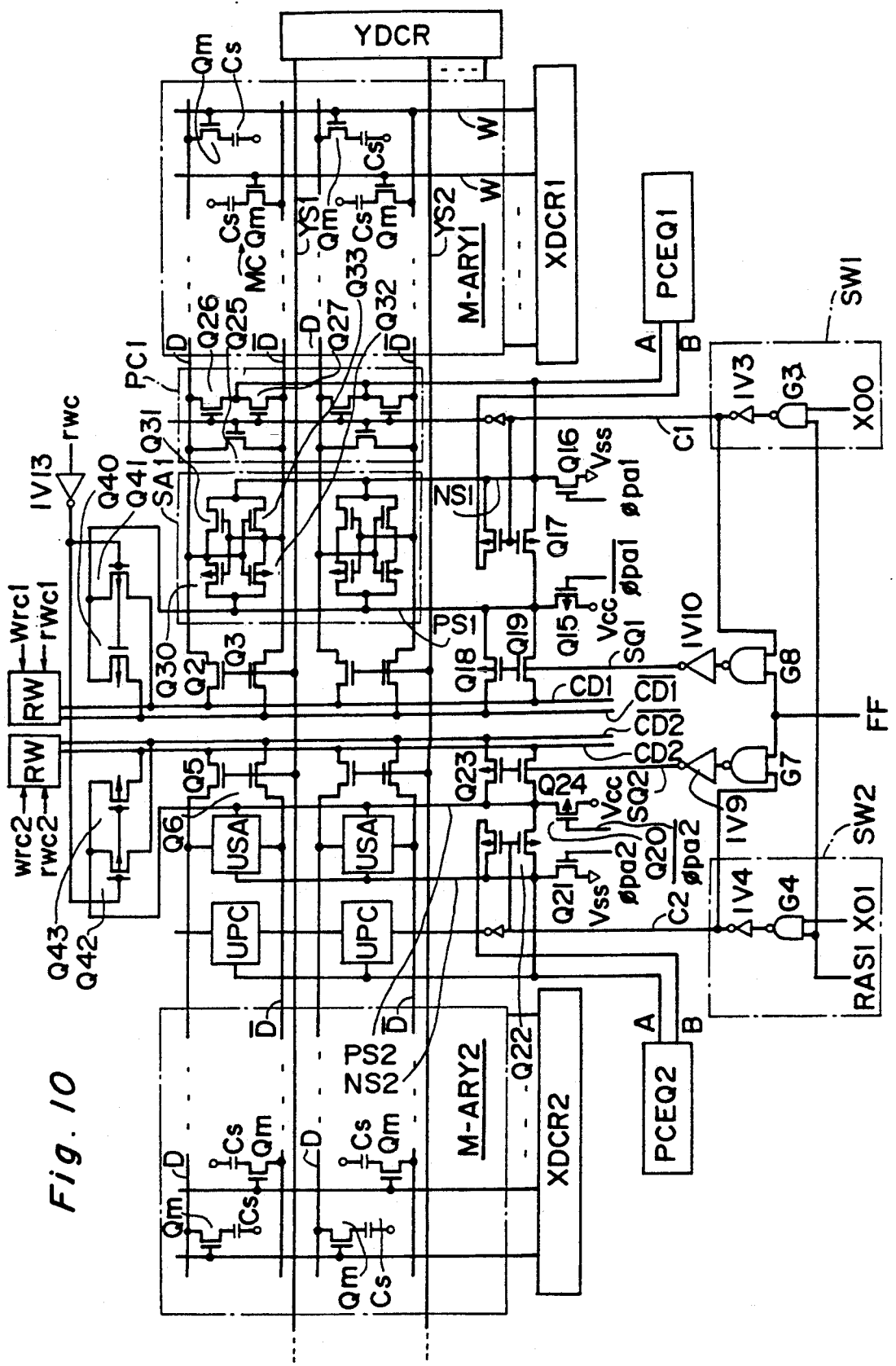
FIG. 10 is a circuit diagram of a read circuit of a random access memory and its peripheral circuit of Example 5.
Figure 11:
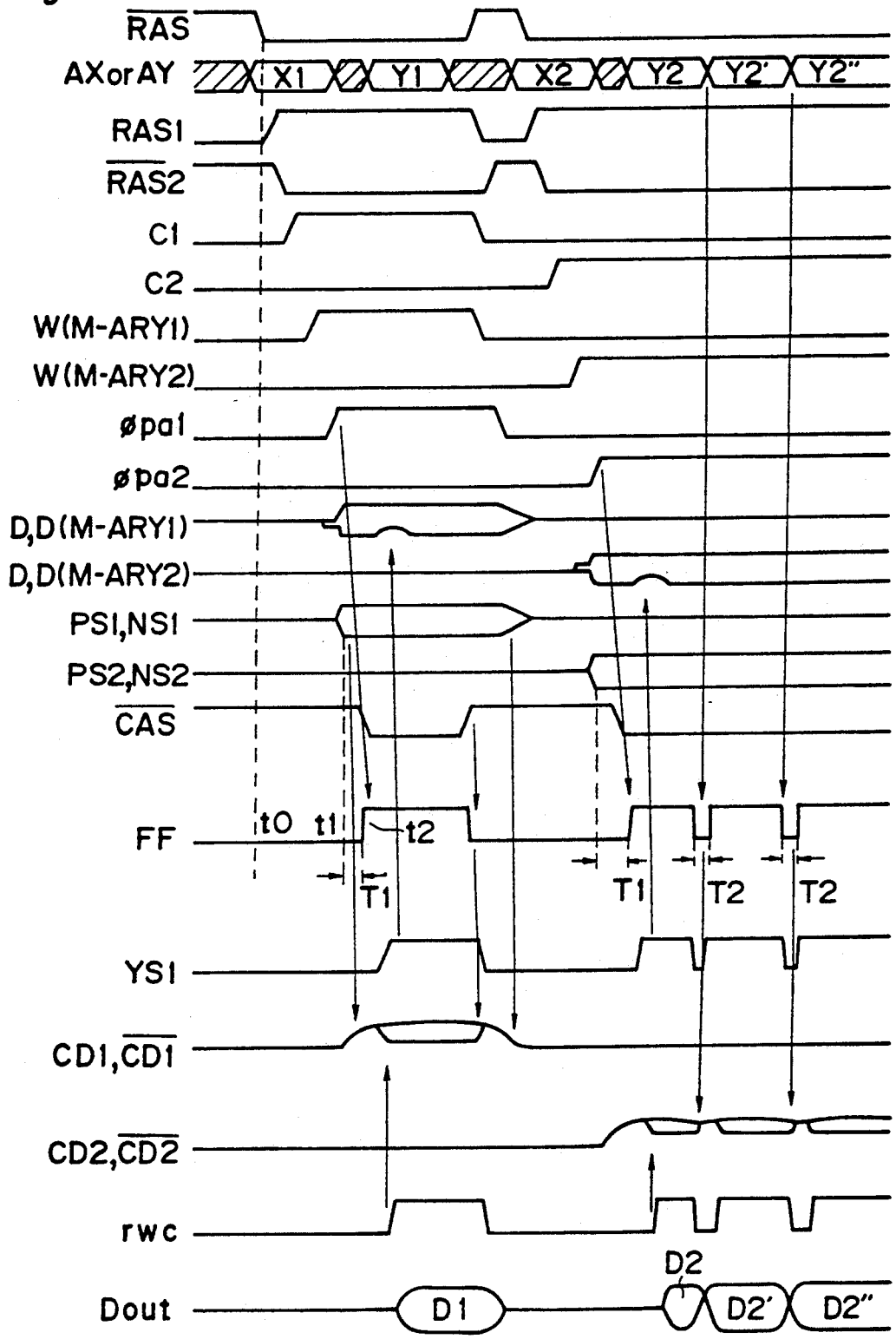
FIG. 11 is a timing chart of the dynamic random access memory shown in FIG. 10.

A dynamic random access memory of Example 5 is form Example 1 will be explained below. FIG. 10 shows a circuit diagram of a read circuit of the random access memory and its peripheral circuit of this Example, and FIG. 11 shows a timing chart of the dynamic random access memory shown in FIG. 10.

In this Example, as shown in FIG. 10, it is most characteristic that switches Q40, Q41, Q42, Q43 of PMOS transistors, controlled by a control signal rwc of the main amplifier MAn in the circuit RW shown in FIG. 3(a), combine the common source line PSn of PMOS transistors of the sense amplifier SAn with the common data lines CDn, $\overline{CDn}$. Thus, the switches act as a load circuit of the common data lines CDn, $\overline{CDn}$.

Example 5 combines the above-mentioned load circuit with Example 1. As shown in FIG. 11, the common data lines CD1, $\overline{CD1}$ in correspondence to a selected memory array M-ARY1 are combined to the common source line PS1 of the sense amplifier SA1 after the row address strobe signal $\overline{RAS}$ becomes a low level, and keep the precharge level of the bit lines till the sense amplifier SA1 is activated. After the sense amplifier SA1 is activated, the potential of the common source line PS1 of the sense amplifier SA1 rises to $V_{cc}$ as shown in FIG. 11. Thus, the potentials of the common data lines CD1, $\overline{CD1}$ also rise. Then, the common data lines CDn, $\overline{CDn}$ are isolated from the common source line PS1 by a control signal FF, and the common data lines CDn, $\overline{CDn}$ keep the potential. The above-mentioned process is the same as in Example 1.

Then, when the main amplifier MA1 is turned on by a control signal rwc, the common data lines CD1, $\overline{CD1}$ are combined again with the common source line PS1 with switches Q40, Q41, Q42, Q43 having resistances higher than the switches Q18, Q19, Q23, Q24.

Thus, the switches Q40, Q41, Q42 and Q43 become a load circuit for the main amplifier MA1. The magnitude of the load is determined by the current driving power of the switches Q41, Q42, Q43 and Q44. The current driving power is determined so that the potentials of the common data lines CD1, $\overline{CD1}$ are not amplified to Vss but limited at an intermediate level, as shown in FIG. 11, when the common data lines CD1, $\overline{CD1}$ are combined with the bit lines D, $\overline{D}$ by the switches Q1, Q2, Q3, Q4.

The magnitude of the load is usually determined by the voltage between the gate and the source of the switches Q40, Q41, Q42, Q43. Therefore, if a line in correspondence to the source is connected to the power supply voltage $V_{cc}$ in contrast to Example 5, the magnitude of the load is constant as far as the power supply voltage $V_{cc}$ does not vary largely. However, this has a problem explained below.

For example, if the amplification of the sense amplifier SA1 is not sufficient because the potentials of the common source lines PS1 and NS1 do not reach $V_{ss}$ and $V_{cc}$, respectively, the current driving power of the sense amplifier SA1 becomes small. On the other hand, the magnitude of load of the load circuit of the switches Q40, Q41 of PMOS transistor does not vary, as explained above. Then, if the common data lines CD1, $\overline{CD1}$ are combined with the bit lines D, $\overline{D}$ with the switches Q2, Q3 of NMOS transistors controlled by the common bit line selection signal line YS1, the potential difference between the common data lines CD1, $\overline{CD1}$ is liable to be insufficient because the magnitude of load is too large than the current driving power of the sense amplifier SA1.

On the contrary, in the circuit of Example 5, the load of the load circuit is different from the above-mentioned circuit because the switches Q40, Q41 are connected to the common source line PS1. Therefore, if the potential of the common source line PS1 does not reach $V_{cc}$ sufficiently, the load of the load circuit becomes low automatically. Then, even if the current driving power of the sense amplifier SA1 becomes small, the above-mentioned problem is solved.

Further, this load circuit does not need a selection circuit in correspondence to the selection of memory array. That is, because the common source line PSn for non-selected memory arrays are connected to the common data lines CD1, $\overline{CD1}$ via the switches Q23, Q24, the potential does not vary and the surge current does not flow even if the common source line PSn is further connected to the common data lines CD1, $\overline{CD1}$ by the switches Q42, Q43.

Thus, a selection circuit is not needed and the layout area is not needed to be decreased accordingly.

EXAMPLE 6

Figure 12:
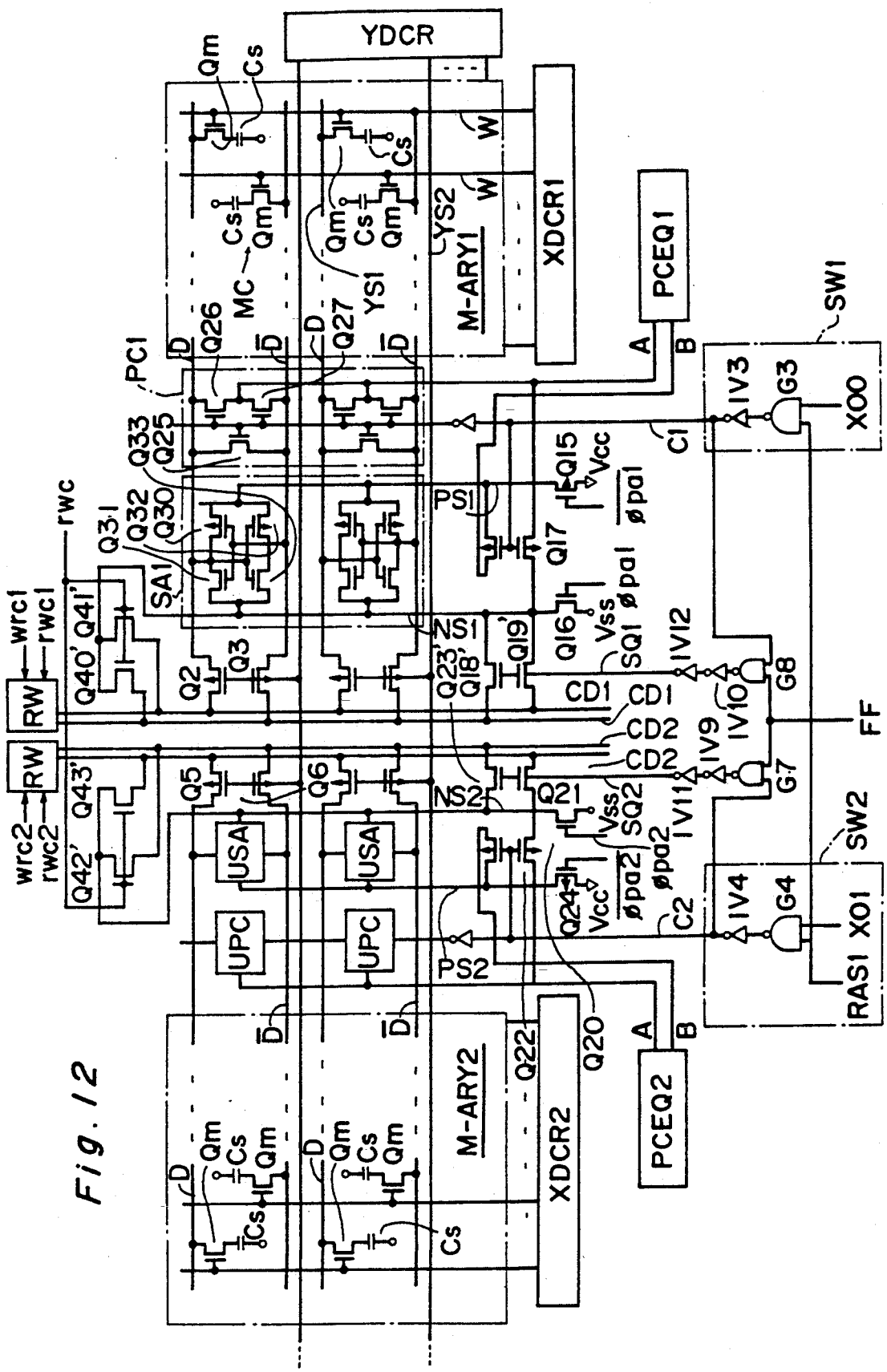
FIG. 12 is a circuit diagram of a read circuit of a random access memory and its peripheral circuit of Example 6.
Figure 13:
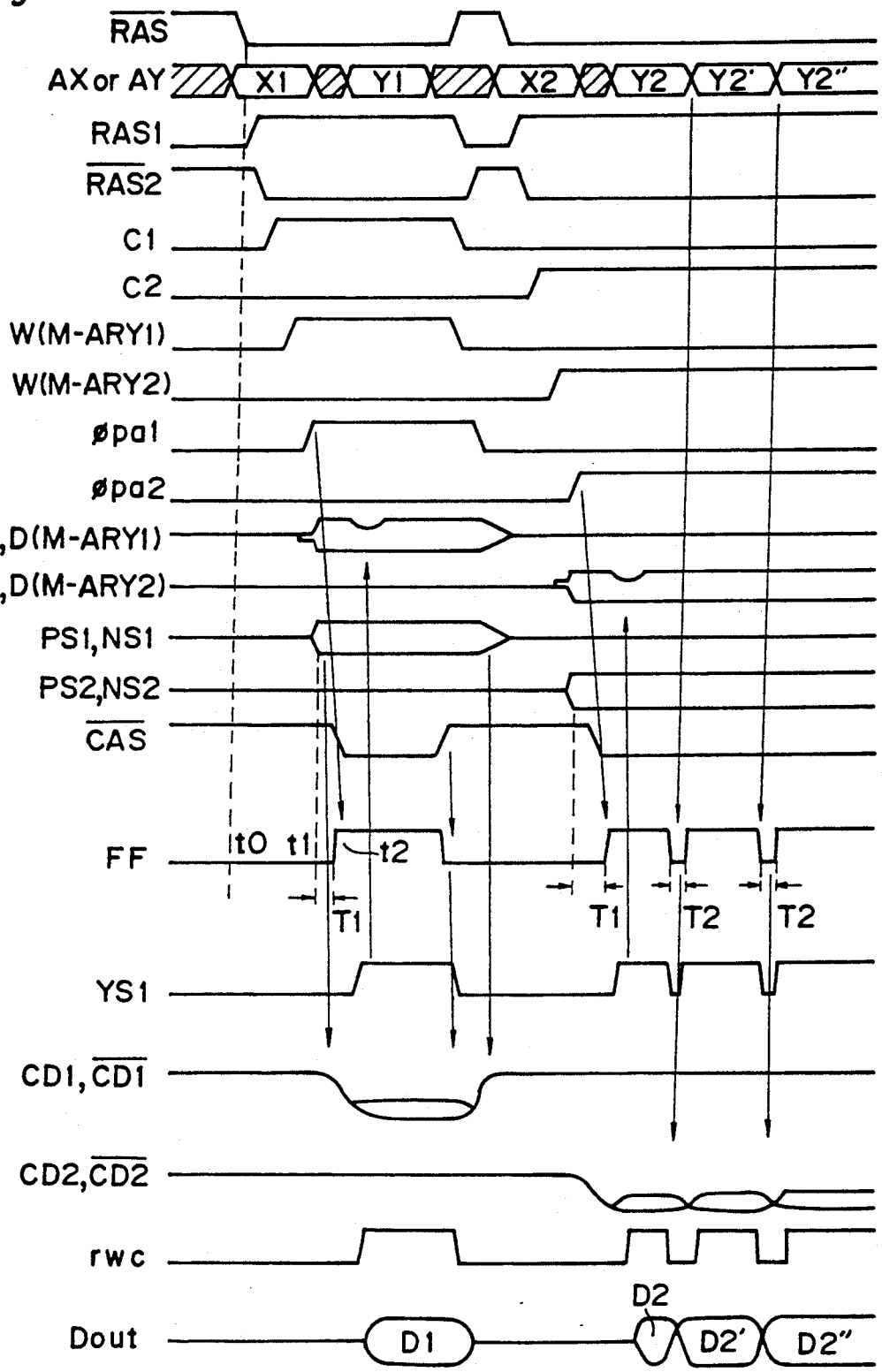
FIG. 13 is a timing chart of the dynamic random access memory shown in FIG. 12.

A dynamic random access memory of Example 6 is mainly the same as that of Example 3, and only the difference from Example 3 will be explained below. FIG. 12 shows a circuit diagram of a read circuit of the random access memory and its peripheral circuit of this Example, and FIG. 13 shows a timing chart of the dynamic random access memory shown in FIG. 12.

In this Example, as shown in FIG. 12, it is most characteristic that switches Q40', Q41', Q42', Q43' of NMOS transistors, controlled by a control signal rwc of the main amplifier MAn in the circuit RW shown in FIG. 3(a), combine the common source line NSn of the NMOS transistors of the sense amplifier SAn with the common data lines CDn, $\overline{CDn}$. Thus, the switches act as a load circuit of the common data lines CDn, $\overline{CDn}$.

Example 6 combines the above-mentioned load circuit with Example 3. As shown in FIG. 13, the common data lines CD1, $\overline{CD1}$ in correspondence to a selected memory array M-ARY1 are combined to the common source line NS1 of the sense amplifier SA1 after the row address strobe signal $\overline{RAS}$ becomes a low level, and keep the precharge level of the bit lines till the sense amplifier SA1 is activated. After the sense amplifier SA1 is activated, the potential of the common source line NS1 of the sense amplifier SA1 drops to $V_{ss}$ as shown in FIG. 13. Thus, the potentials of the common data lines CD1, $\overline{CD1}$ also drop. Then, the common data lines CDn, e,ovs/CDn/ are isolated from the common source line NS1 by a control signal FF, and the common data lines CDn, $\overline{CDn}$ keep the potential. The above-mentioned process is the same as in Example 3.

Then, when the main amplifier MA1 is turned on by a control signal rwc, the common data lines CD1, $\overline{CD1}$ are combined again with the common source line NS1 with switches Q40', Q41', Q42', Q43' having resistances higher than the switches Q18', Q19', Q23', Q24'.

Thus, the switches Q40', Q41', Q42' and Q43' act as a load circuit for the main amplifier MA1. The magnitude of the load is determined by the current driving power of the switches Q41', Q42', Q43' and Q44', The current driving power is determined so that the potentials of the common data lines CD1, $\overline{CD1}$ are not amplified to Vcc but limited at an intermediate level, as shown in FIG. 13, when the common data lines CD1, $\overline{CD1}$ are combined with the bit lines D, $\overline{D}$ by the switches Q1, Q2, Q3, Q4.

The magnitude of the load is usually determined by the voltage between the gate and the source of the switches Q40', Q41', Q42', Q43'. Therefore, if a line in correspondence to the source is connected to the power supply voltage $V_{ss}$ in contrast to Example 6, the magnitude of the load is constant as far as the ground voltage $V_{ss}$ does not vary largely. However, this case has a problem to be explained below.

For example, if the amplification of the sense amplifier SA1 is not sufficient because the potentials of the common source lines PS1 and NS1 do not reach $V_{ss}$ and $V_{cc}$, respectively, the current driving power of the sense amplifier SA1 becomes small. On the other hand, the magnitude of load of the load circuit of the switches Q40, Q41 of NMOS transistor does not vary, as explained above. Then, if the common data lines CD1, $\overline{CD1}$ are combined with the bit lines D, $\overline{D}$ with the switches Q2, Q3 of PMOS transistors controlled by the common bit line selection signal line YS1, the potential difference between the common data lines CD1, $\overline{CD1}$ is liable to be insufficient because the magnitude of load is too large than the current driving power of the sense amplifier SA1.

On the contrary, in the circuit of Example 6, the load of the load circuit is different from the above-mentioned circuit because the switches Q40, Q41 are connected to the common source line NS1. Therefore, if the potential of the common source line NS1 does not reach $V_{ss}$ sufficiently, the load of the load circuit becomes low automatically. Then, even if the current driving power of the sense amplifier SA1 becomes small, the above-mentioned problem is solved.

Further, this load circuit does not need a selection circuit in correspondence to the selection of memory array. That is, because the common source line NSn for non-selected memory arrays are connected to the common data lines CD1, $\overline{CD1}$ via the switches Q23, Q24, the potential does not vary and the surge current does not flow even if the common source line NSn is further connected to the common data lines CD1, $\overline{CD1}$ by the switches Q42, Q43.

Thus, a selection circuit is not needed and the layout area is not needed to be decreased accordingly.

As explained above, in the above-mentioned dynamic random access memories, pull-up and pull-down circuits for the common data lines are not needed, and selection circuits for them are also not needed. Therefore, the layout area near the main amplifier can be decreased. Further, timing circuits and the control lines therefor are not needed because the timing for turning on the pull-up and pull-down circuits is determined automatically at the timing of the activation of the sense amplifier. Therefore, this circuit is advantageous practically for a read circuit for a dynamic random access memory of high integration, high density and high speed.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A dynamic random access memory, comprising:
    a plurality of memory arrays, which memory array including a plurality of memory cells each including a transistor for address selection and a capacitor for storing information, which memory cells being located at intersections of pairs of bit lines and word lines as a matrix;
    a bit line selector for selecting a pair of said pairs of bit lines by decoding a received address;
    word line selectors, provided for each memory array, for selecting a word line only for a memory array including a memory cell by decoding the received address;
    sense amplifiers for amplifying a signal of a memory cell selected by said bit line selector and said word line selector, which sense amplifier having common source lines providing a power source potential and a ground potential as operating potentials necessary for the amplification;
    column switches, provided for each memory array, for connecting a pair of said pairs of bit lines selected by said bit line selector in a memory array with a pair of common data lines;
    read and write means, provided for each memory array, for reading or writing information from or in the pair of common data lines;
    selectors, provided for each memory array, for selecting a sense amplifier according to the selected word line;
    switches, provided for each memory array, for connecting one of the common source lines of said sense amplifier with the common data lines in a memory array selected according to the address in a non-selected period as well as in a selected period, said selected period being a period wherein the memory array is selected, said non-selected period being a period wherein the memory array is not selected;
    first prechargers, provided for each memory array, for precharging said bit lines in said memory arrays at a first precharge potential; and
    second prechargers for precharging said common source lines at a second precharge potential in a non-selected period of said sense amplifier.

2. A dynamic random access memory according to claim 1, wherein said sense amplifier includes a CMOS inverter, the source lines of the N channel MOSFET and of P channel MOSFET included in said CMOS inverter being connected commonly, respectively, the ground potential being provided to the common source line of said N channel MOSFETs in a period for amplification, the power supply potential being provided to said common source line of said P channel MOSFETs in the period for amplification, said common source lines being precharged at the second precharge potential in the non-selected period.

3. A dynamic random access memory according to claim 1, wherein said second precharge potential is almost equal to said first precharge potential.

4. A dynamic random access memory according to claim 2, wherein the common source line of the N channel MOSFETs of said sense amplifier is connected via said switch to the common data lines in the selected period as well as in the non-selected period.

5. A dynamic random access memory according to claim 2, wherein the common source line of the P channel MOSFET of said sense amplifier is connected via said switch to the common data line in the selected period as well as in the nonselected period.

6. A dynamic random access memory according to claim 1, wherein said read and write means include a switch for connecting said common data line to each other after information of said bit lines is transferred to said common data lines in the memory array selected according to the address.

7. A dynamic random access memory according to claim 6, wherein said switch for connecting said one of common source lines of the sense amplifier to said common data lines in the selected memory array is turned off only in an active period in the selected period.

8. A dynamic random access memory, comprising:
a plurality of memory arrays, which memory array including a plurality of memory cells each including a transistor for address selection and a capacitor for storing information, which memory cells being located at intersections of pairs of bit lines and word lines as a matrix;
a bit line selector for selecting a pair of said pairs of bit lines by decoding a received address;
word line selectors, provided for each memory array, for selecting a word line only for a memory array including a memory cell by decoding the received address;
sense amplifiers for amplifying a signal of a memory cell selected by said bit line selector and said word line selector, which sense amplifier having common source lines providing a power source potential and a ground potential as operating potentials necessary for the amplification;
column switches, provided for each memory array, for connecting a pair of said pairs of bit lines selected by said bit line selector in a memory array with a pair of common data lines;
read and write means, provided for each memory array, for reading or writing information from or in the pair of common data lines;
selectors, provided for each memory array, for selecting a sense amplifier according to the selected word line;
switches, provided for each memory array, for connecting one of the common source lines of said sense amplifier with the common data lines in a memory array selected according to the address in a non-selected period as well as in a selected period, said selected period being a period wherein the memory array is selected, said non-selected period being a period wherein the memory array is not selected;
first prechargers, provided for each memory array, for precharging said bit lines in said memory arrays at a first precharge potential; and
second prechargers for precharging one of said common source lines at a second precharge potential and the other of said common source lines at a third precharge potential in a non-selected period of said sense amplifier, said second and third precharge potentials being different from each other.

9. A dynamic random access memory according to claim 8, wherein said sense amplifier includes a CMOS inverter, the source lines of the N channel MOSFET and of P channel MOSFET included in said CMOS inverter being connected commonly, respectively, the ground potential being provided to the common source line of said N channel MOSFETs in a period for amplification, the power supply potential being provided to said common source line of said P channel MOSFETs in the period for amplification, said common source lines being precharged at the second precharge potential in the nonselected period.

10. A dynamic random access memory according to claim 8, wherein one of said second and third precharge potentials is almost equal to said first precharge potential.

11. A dynamic random access memory according to claim 9, wherein the common source line of the N channel MOSFETs of said sense amplifier is connected via said switch to the common data lines in the selected period as well as in the non-selected period.

12. A dynamic random access memory according to claim 9, wherein the common source line of the P channel MOSFET of said sense amplifier is connected via said switch to the common data line in the selected period as well as in the nonselected period.

13. A dynamic random access memory according to claim 8, wherein said read and write means include a switch for connecting said common data line to each other after information of said bit lines is transferred to said common data lines in the memory array selected according to the address.

14. A dynamic random access memory according to claim 13, wherein said switch for connecting said one of common source lines of the sense amplifier to said common data lines in the selected memory array is turned off only in an active period in the selected period.

15. A dynamic random access memory, comprising:
a plurality of memory arrays, which memory array including a plurality of memory cells each including a transistor for address selection and a capacitor for storing information, which memory cells being located at intersections of pairs of bit lines and word lines as a matrix;
a bit line selector for selecting a pair of said pairs of bit lines by decoding a received address;
word line selectors, provided for each memory array, for selecting a word line only for a memory array including a memory cell by decoding the received address;
sense amplifiers for amplifying a signal of a memory cell selected by said bit line selector and said word line selector, which sense amplifier having common source lines providing a power source potential and a ground potential as operating potentials necessary for the amplification;
column switches, provided for each memory array, for connecting a pair of said pairs of bit lines selected by said bit line selector in a memory array with a pair of common data lines;
read and write means, provided for each memory array, for reading or writing information from or in the pair of common data lines, said read and write means including a switch for connecting said common data line to each other after information of said bit lines is transferred to said common data lines in the memory array selected according to the address;

selectors, provided for each memory array, for selecting a sense amplifier according to the selected word line;

switches, provided for each memory array, for connecting one of the common source lines of said sense amplifier with the common data lines in a memory array selected according to the address in a non-selected period as well as in a selected period, said selected period being a period wherein the memory array is selected, said non-selected period being a period wherein the memory array is not selected;

first prechargers, provided for each memory array, for precharging said bit lines in said memory arrays at a first precharge potential;

second prechargers for precharging said common source lines at a second precharge potential in a non-selected period of said sense amplifier; and load circuits, provided for each memory array, for loading the common data lines for reading information when said switch of said read and write circuit is turned off.

16. A dynamic random access memory according to claim 15, wherein said load circuit includes a circuit for pulling up said common data lines and said one of common source lines of said sense amplifier supplies a power supply potential to a power supply connected to the pull-up circuit.

17. A dynamic random access memory according to claim 15, wherein said load circuit includes a circuit for pulling down said common data lines and said one of common source lines of said sense amplifier supplies a ground potential to a power supply connected to the pull-down circuit.

* * * * *